(12) United States Patent
Liang et al.

(10) Patent No.: US 10,927,456 B2
(45) Date of Patent: Feb. 23, 2021

(54) REACTION CHAMBER FOR VAPOR DEPOSITION APPARATUS

(71) Applicant: Hermes-Epitek Corp., Taipei (TW)

(72) Inventors: Yu-Sheng Liang, Hsinchu (TW); Chien-Chin Chiu, Tainan (TW); Tsan-Hua Huang, Tainan (TW); Oishi Takahiro, Sagamihara (JP); Suda Noboru, Kyoto (JP); Komeno Junji, Kanagawa (JP)

(73) Assignee: HERMES-EPITEK CORP., Taipei (TW)

( * ) Notice: Subject to any disclaimer, the term of this patent is extended or adjusted under 35 U.S.C. 154(b) by 64 days.

(21) Appl. No.: 16/447,225

(22) Filed: Jun. 20, 2019

(65) Prior Publication Data

US 2020/0017964 A1 Jan. 16, 2020

(30) Foreign Application Priority Data

Jun. 21, 2018 (TW) .............................. 107121309 A

(51) Int. Cl.
*C23C 16/44* (2006.01)
*C23C 16/458* (2006.01)

(52) U.S. Cl.
CPC ...... *C23C 16/4411* (2013.01); *C23C 16/4583* (2013.01)

(58) Field of Classification Search
CPC . C23C 16/44; C23C 16/458; C23C 16/45572; C23C 14/541; C23C 16/4411
See application file for complete search history.

(56) References Cited

U.S. PATENT DOCUMENTS

2011/0126761 A1 6/2011 Lee et al.
2012/0003389 A1 1/2012 Brien et al.

FOREIGN PATENT DOCUMENTS

TW 552315 B 9/2003
WO WO-2012/139006 A2 10/2012

OTHER PUBLICATIONS

Search Report of TW Application No. 107121309, completed on Feb. 11, 2019, 2 pages.

*Primary Examiner* — Yuechuan Yu
(74) *Attorney, Agent, or Firm* — Muncy, Geissler, Olds & Lowe, P.C.

(57) ABSTRACT

A reaction chamber for vapor deposition apparatus, comprises a susceptor to carry substrates, a ceiling, an upper cavity, and protrusions. The ceiling comprises a front surface faces the substrates and comprises front convex parts and front concave parts with an interlaced arrangement to form a convex-concave surface. The ceiling also comprises a rear surface opposites to the front surface and comprises rear convex parts and rear concave parts corresponded to the front concave parts and the front convex parts respectively. The upper cavity opposites to the rear surface and separated to the rear convex parts to define a first flow channel. The protrusions are disposed in the rear concave parts and separated to a side wall and a bottom wall of the rear concave parts to define a second flow channel which is connected to the first flow channel to introduce a cooling fluid.

13 Claims, 5 Drawing Sheets

BB'

REACTION CHAMBER FOR VAPOR DEPOSITION APPARATUS

FIELD OF THE INVENTION

The present disclosure relates to a reaction chamber for a vapor deposition apparatus, and especially to a reaction chamber of reducing a ceiling temperature difference.

BACKGROUND OF THE INVENTION

In modern semiconductor industry, a vapor deposition is employed to grow a thin film. In a conventional (planetary type) MOCVD reactor, a ceiling having a concavo-convex parts shape has been used for heat dissipation, as shown in FIG. 1. The surface of the ceiling 2 in FIG. 1, facing the substrate W, comprises front convex parts 200 and front concave parts 202. The front convex parts 200 is solid, so the thickness of the ceiling is not uniform, i.e. the thicker front convex parts 200 and the thinner front concave parts 202. During vapor deposition, one end of the ceiling 2 facing the substrate W is operating at an extremely high temperature, and another end is cooling via a cooling device 3 or a cooling flow to avoid the non-necessary pre-reaction.

However, the ceiling shown in FIG. 1 have different heat dissipation efficiencies at different positions because the non-uniform thickness. For instance, the heat dissipation efficiency of the front convex parts 200 is low and high for front concave parts 202 relatively. Different heat dissipation efficiency causes a larger temperature difference between the upper and lower parts of the ceiling. For instance, the temperature difference exceeds 30° C. or above will incur a non-uniform stress over the ceiling, and that may break the ceiling.

It is the topic to solve the problem of large temperature difference between the upper and lower parts of the ceiling without affecting the vapor deposition process.

SUMMARY OF THE INVENTION

The present disclosure provides a reaction chamber for a vapor deposition apparatus, and the reaction chamber is designed to have a ceiling with uniform or near-uniform thickness. The flow space between the ceiling and the upper cavity can be adjusted cavity to have a un-obstacle flow channel and heat dissipation to reduce the temperature difference of the ceiling.

A reaction chamber according to an embodiment of the present disclosure comprises a susceptor for carrying substrates, a ceiling, an upper cavity, and protrusions. The front surface of the ceiling, facing the substrates, comprises front convex parts and front concave parts in an interlace arrangement to form a convex-concave surface. Each of the front concave parts is used as a gas channel. The rear surface of ceiling can be understood to have rear convex parts and rear concave parts corresponding to the front concave parts and the front convex parts of the front surface respectively. An upper cavity is disposed opposite to the rear surface of the ceiling, and each of the rear convex parts of the rear surface forms a first flow channel. Protrusions are disposed in the rear concave parts of the rear surface and separated to a side wall and a bottom wall, and the space of the rear concave parts forms a second flow channel, which is connected to the first flow channel for introducing a cooling fluid.

BRIEF DESCRIPTION OF THE DRAWINGS

Various embodiments are depicted in the accompanying drawings for illustrative purposes, and should in no way be interpreted as limiting the scope of the embodiments. Various features of different disclosed embodiments can be combined to form additional embodiments, which are part of this disclosure. The foregoing aspects and many of the attendant advantages of the present disclosure will become more readily appreciated as the same become better understood by reference to the following detailed description, when taken in conjunction with the accompanying drawings, wherein.

DETAILED DESCRIPTION

Figure 1:
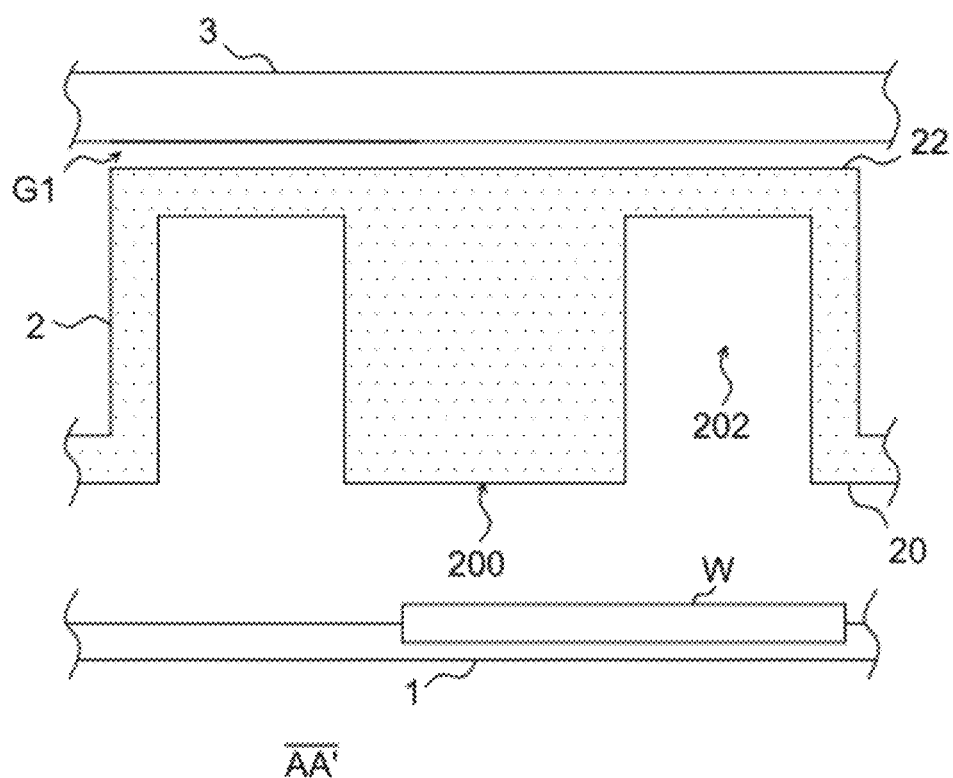
FIG. 1 is a schematic view showing a cross-sectional view of a conventional reaction chamber for a vapor deposition apparatus.
Figure 2:
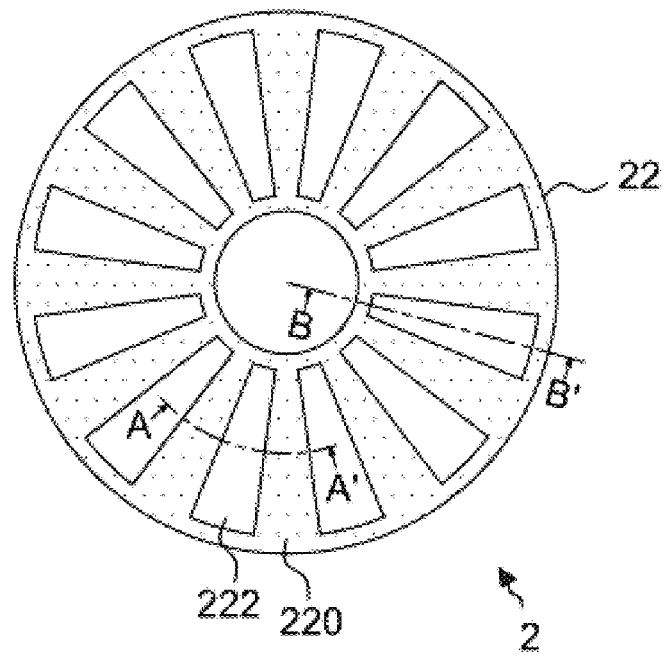
FIG. 2 is a schematic view showing a top view of a ceiling according to an embodiment of the present disclosure.
Figure 3:
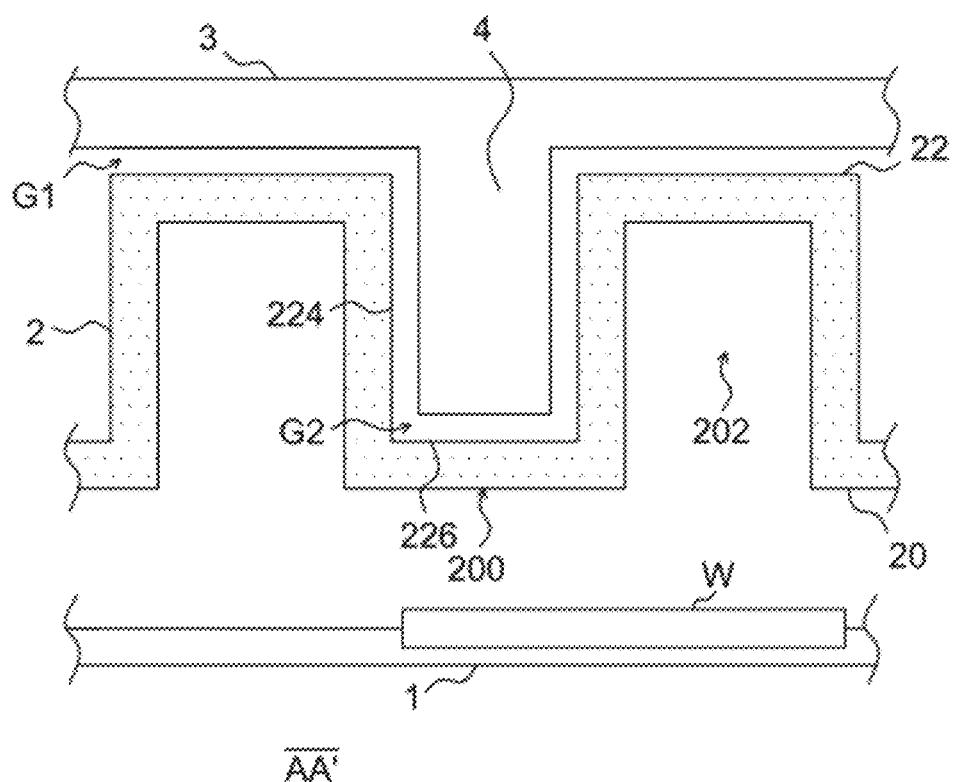
FIG. 3 is a schematic view showing a cross-sectional view of the ceiling of FIG. 2 taken along line A-A'.

With reference to FIG. 2 and FIG. 3, the reaction chamber of an embodiment of the present disclosure comprises: a susceptor 1, a ceiling 2, an upper cavity 3, and protrusions 4. The susceptor 1 is used to carry substrates W. The front surface 20 of the ceiling 2, facing the substrates W, comprises front convex parts 200 and front concave parts 202 with an interlaced arrangement to form a convex-concave surface. Each of the front concave parts 202 is used as a gas channel. The rear surface 22 of the ceiling 2, opposites to the front surface 20, comprises rear convex parts 220 and rear concave parts 222 corresponding to the front concave parts 202 and the front convex parts 200, as shown in FIG. 2.

The rear convex parts 220 and the rear concave parts 222 of the rear surface 22 are radially arranged outward from a center of the ceiling 2. As described above, the front concave parts 202 corresponding to the rear convex parts 220, and the front convex parts 200 corresponding to the rear concave parts 222, so the thickness of the ceiling 2 is uniform, i.e. the thickness of the ceiling 2 is made uniform or near-uniform, as shown in FIG. 3. It should be noted that the number of the front concave parts 202 and the front convex parts 200 should not be limited by the drawings, which can be designed to have two to more depending on the requirements. In addition, in one embodiment, the front concave parts 202 and the front convex parts 200 is designed to be symmetrical and evenly distributed over the ceiling 2, that is, the width of the front concave parts 202 may be equal to the front convex parts 200. In another embodiment, the front concave parts 202 and the front convex parts 200 may be unevenly distributed on the ceiling 2. For instance, the width of the front concave parts 202 may be greater than the front convex parts 200.

In one embodiment, the reaction chamber further comprises an upper cavity 3, opposites to the rear surface of the ceiling 2. The upper cavity 3 may comprise a cooling pipe for reducing the temperature difference between the upper and lower parts of the ceiling 2. The upper cavity 3 separated to each rear convex part 220 forms a first flow channel G1. Protrusions 4 may be disposed in the rear concave parts 222, separated to a side wall 224 and a bottom wall 226 of the rear concave parts 222 and each forms a second flow channel G2, which is connected to the first flow channel G1 to introduce a cooling fluid. For instance, the hydrogen can be introduced into the first flow channel G1 and/or the second flow channel G2 to facilitate the heat dissipation of the ceiling 2.

Figure 4:
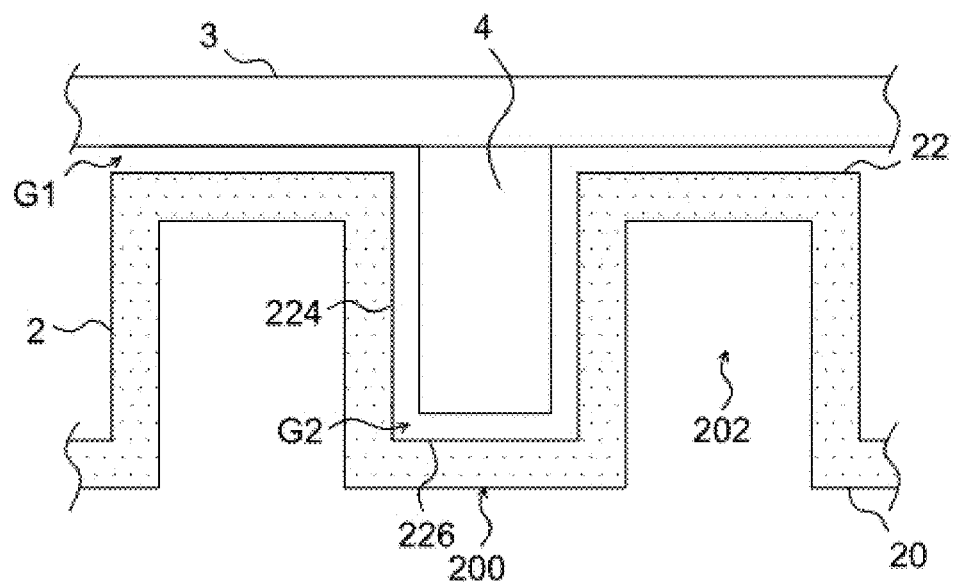
FIG. 4 is a schematic view showing a cross-sectional view of a reaction chamber according to an embodiment of the present disclosure.

In an embodiment of the present disclosure, the protrusions 4 could be designed to protruded from the upper cavity 3, i.e. one-piece structure, as shown in FIG. 3. Alternatively, in another embodiment of the present disclosure, the protrusions 4 are detachably disposed on the upper cavity 3, as shown in FIG. 4. In addition, in an embodiment of the present disclosure, a space is disposed between the upper cavity 3 and the protrusions 4 to form a third flow channel G3, and the third flow channel G3 is connected to the first flow channel G1 to introduce the cooling fluid to pass through the first flow channel G1 and the third flow channel G3 to enhance heat dissipation.

Figure 5:
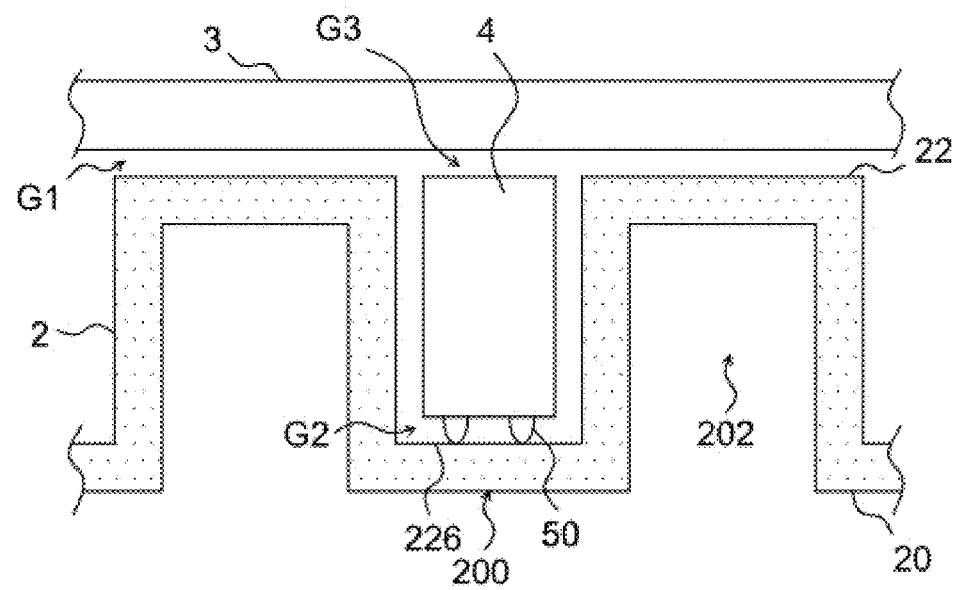
FIG. 5 is a schematic view showing a cross-sectional view of a reaction chamber according to another embodiment of the present disclosure.
Figure 6:
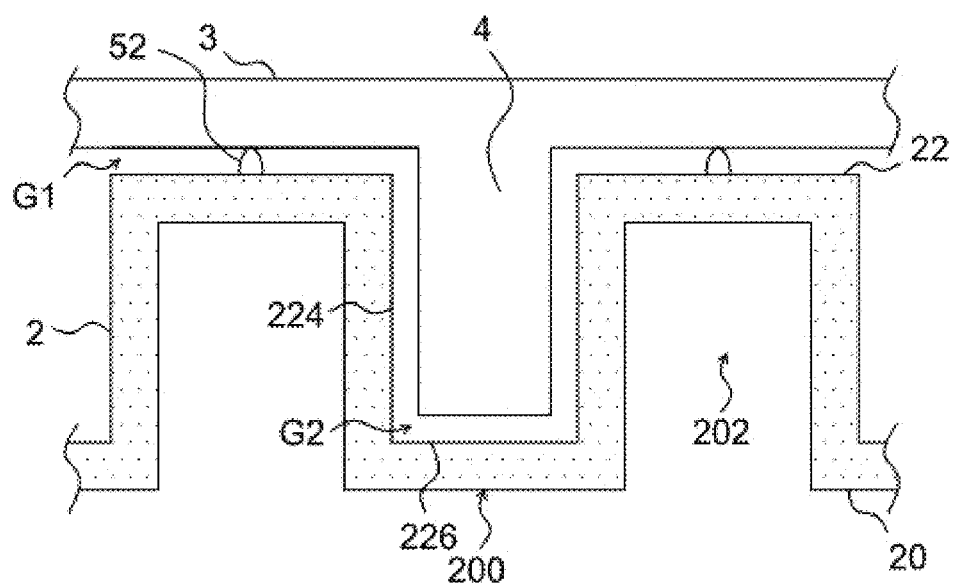
FIG. 6 is a schematic view showing a cross-sectional view of a reaction chamber according to another embodiment of the present disclosure.
Figure 7:
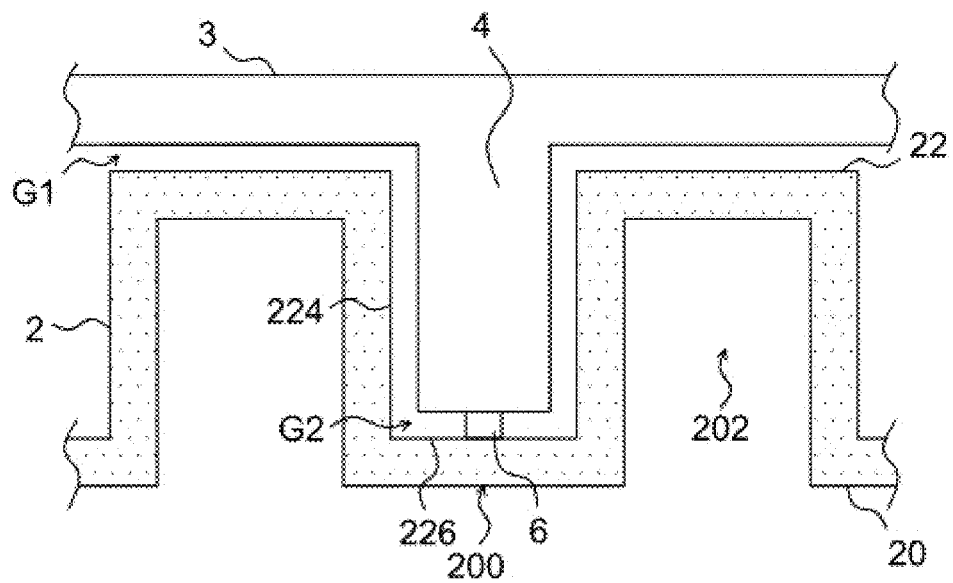
FIG. 7 is a schematic view showing a cross-sectional view of a reaction chamber according to another embodiment of the present disclosure.
Figure 8:
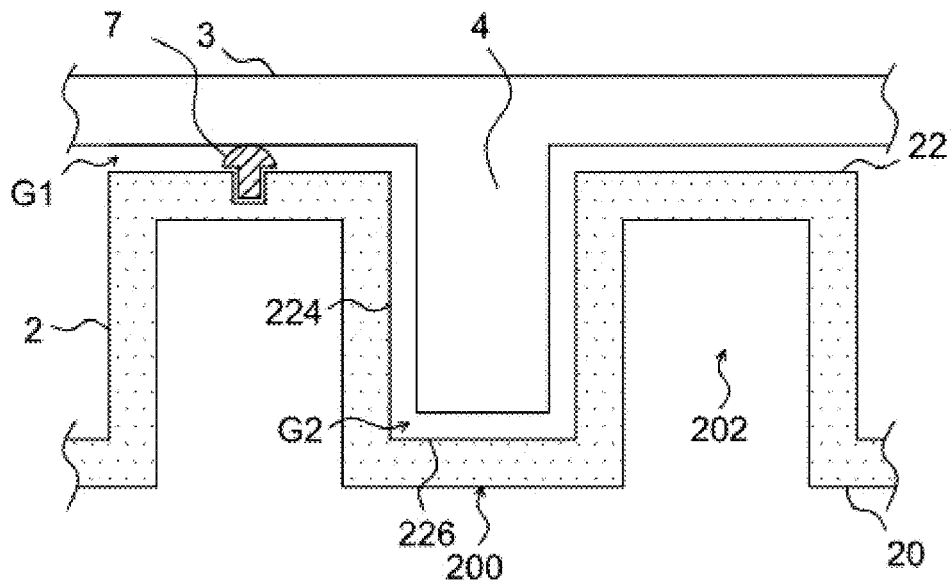
FIG. 8 is a schematic view showing a cross-sectional view of a reaction chamber according to another embodiment of the present disclosure.

It should be noted that a size of each flow channel in the reaction chamber of the present disclosure can be adjusted as needed, please refer to FIG. 5 to FIG. 8. According to an embodiment of the present disclosure, the reaction chamber may further comprise a block 50 disposed between one of the rear concave parts 222 of the rear surface 22 at least and the protrusions 4, and a size of the second flow channel G2 may be determined by the thickness of the block 50, as shown in FIG. 5. According to another embodiment of the present disclosure, the reaction chamber may further comprise a shim 6, which may be disposed between one of the rear concave parts 222 at least and the protrusions 4, and the size of the second flow channel G2 may be determined by the thickness of the shim 6, as shown in FIG. 6. According to another embodiment of the present disclosure, the reaction chamber may further comprise a block 52 disposed on at least one of the rear convex parts 220 and the upper cavity 3, and the thickness of the block 52 may determine a size of the first flow channel; G1, as shown in FIG. 7. According to a further embodiment of the present disclosure, the reaction chamber may further comprise an adjustable element 7 which may protrude from at least one of the rear surface 22 and the upper cavity 3, as shown in FIG. 8. The adjustable element 7 may comprise a screw to adjust the size of the first flow channel G1.

Figure 9:
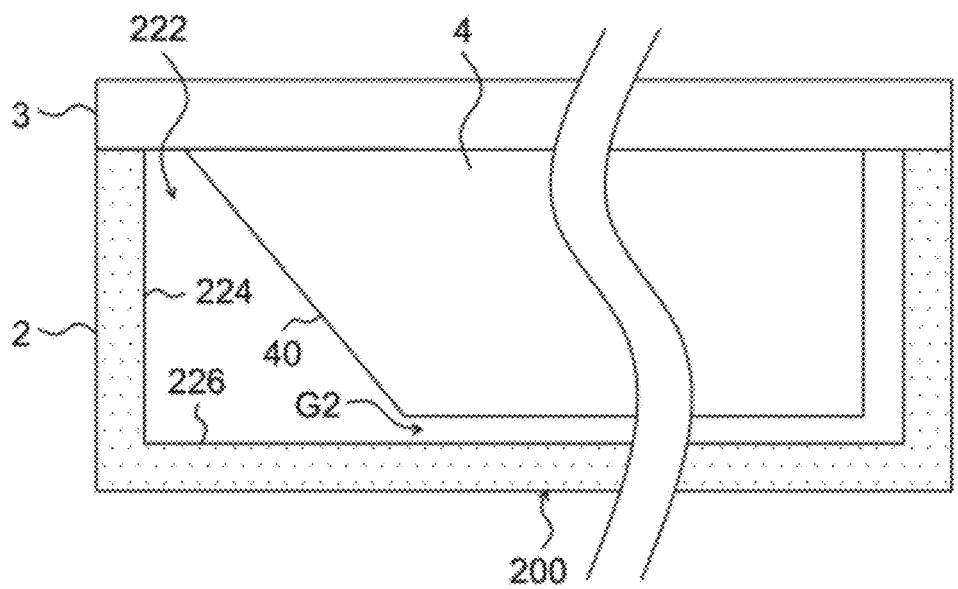
FIG. 9 is a schematic view showing a cross-sectional view of the ceiling of FIG. 2 taken along line B-B'.

In one embodiment, each of the protrusions 4 may have a slanted side 40, as shown in FIG. 9, which is a schematic view showing a cross-sectional view of the ceiling of FIG. 2 taken along line B-B'. The slanted side 40 faces the center of the ceiling 2, and a distance between the slanted side 40 and the side wall 224 of the rear concave parts 222 may gradually increase as approaching the bottom wall 226 of the rear concave parts 222 to form an inclined groove. The inclined groove allows the cooling fluid to evenly enter into each flow channel. In addition, the space created by the shape of the inclined groove is able to reduce the heat transformation from the ceiling 2 to the upper cavity 3, and as a result to increase the temperature near the ceiling center, as a result to reduce the temperature difference between the upper and lower surfaces at the center of the ceiling 2.

In summary, the reaction chamber for a vapor deposition apparatus of the present disclosure has a ceiling having uniform or near-uniform thicknesses. According to configuration, the front concave parts and the rear convex parts and front convex parts and the rear concave parts are corresponded to reduce the temperature difference between the upper and lower parts of the ceiling, and avoid to break the ceiling due to large temperature difference. In addition, the reaction chamber for the vapor deposition apparatus of the present disclosure has a uniform space between the ceiling and the upper cavity by the arrangement of the protrusions, thereby the cooling fluid flows evenly in the channel to dissipate heat. It can effectively dissipate heat and reduce the temperature difference of the ceiling without using a large amount of cooling fluid, and reduce the cost of the process.

The embodiments described above are merely illustrative of the technical spirit and features of the present disclosure, and are intended to enable those skilled in the art to understand the present disclosure and exploit the present disclosure. The scope of the claim, that is, the equivalent changes or modifications made by the spirit of the present disclosure, should still be included in the scope of the claim of the present disclosure.

What is claimed is:

1. A reaction chamber for a vapor deposition apparatus, comprising: a susceptor to carry substrates; a ceiling, comprising: a front surface, facing the substrates, comprising front convex parts and front concave parts with an interlaced arrangement to form a convex-concave surface, wherein each of the front concave parts is configured to be a flow channel; and a rear surface, opposite to the front surface, comprising rear convex parts and rear concave parts corresponding to the front concave parts and the front convex parts respectively; an upper cavity, facing the rear surface and separated from the rear convex parts to define a first flow channel; and protrusions are disposed in the rear concave parts and separated from a side wall and a bottom wall of the rear concave parts to define a second flow channel which is connected to the first flow channel to introduce a cooling fluid.

2. The reaction chamber of claim 1, wherein the rear convex parts and the rear concave parts are radially arranged outward from a center of the ceiling.

3. The reaction chamber of claim 1, wherein a width of the front concave parts (Channel zone) is greater than or equal to a width of the front convex parts (Bar zone).

4. The reaction chamber of claim 1, wherein each of the protrusions has a slanted side facing a center of the ceiling, and a distance between the slanted side and the side wall of the rear concave parts gradually increases as approaching the bottom wall of the rear concave parts to form an inclined groove.

5. The reaction chamber of claim 1, wherein the protrusions are detachably disposed on the upper cavity.

6. The reaction chamber of claim 1, wherein the upper cavity and the protrusions have a third flow channel, and the third flow channel is connected to the first flow channel.

7. The reaction chamber of claim 1, wherein the upper cavity and the protrusions are one-piece-formed.

8. The reaction chamber of claim 1, further comprising a block that is disposed on at least one of the rear concave parts and the protrusions to determine a size of the second flow channel.

9. The reaction chamber of claim 1, further comprising a shim that is disposed between the rear concave parts and the protrusions to determine a size of the second flow channel.

10. The reaction chamber of claim 1, further comprising a block that is disposed on at least one of the rear convex parts and the upper cavity to determine a size of the first flow channel.

11. The reaction chamber of claim 1, further comprising an adjusting element that protrudes from at least one of the rear surface and the upper cavity to adjust a size of the first flow channel.

12. The reaction chamber of claim 11, wherein the adjusting element comprises a screw.

13. The reaction chamber of claim 1, wherein the upper cavity further comprises a cooling pipe.

* * * * *